US010333269B2

(12) United States Patent
Luft et al.

(10) Patent No.: US 10,333,269 B2
(45) Date of Patent: Jun. 25, 2019

(54) CONTROLLING OUTPUT POWER OF A LASER AMPLIFIER WITH VARIABLE PULSE RATE

(71) Applicant: Apple Inc., Cupertino, CA (US)

(72) Inventors: Ido Luft, Sunnyvale, CA (US); Andrew J. Sutton, Sunnyvale, CA (US); Ronen Akerman, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/849,700

(22) Filed: Dec. 21, 2017

(65) Prior Publication Data

US 2019/0097380 A1    Mar. 28, 2019

Related U.S. Application Data

(60) Provisional application No. 62/563,696, filed on Sep. 27, 2017.

(51) Int. Cl.
| | | |
|---|---|---|
| *H01S 3/10* | (2006.01) | |
| *H01S 3/23* | (2006.01) | |
| *H01S 3/094* | (2006.01) | |
| *H01S 5/065* | (2006.01) | |

(52) U.S. Cl.
CPC .... *H01S 3/10038* (2013.01); *H01S 3/094003* (2013.01); *H01S 3/10046* (2013.01); *H01S 3/10084* (2013.01); *H01S 3/2308* (2013.01); *H01S 5/0656* (2013.01)

(58) Field of Classification Search
CPC ............. H01S 3/10038; H01S 3/10046; H01S 3/2308; H01S 3/094003; H01S 5/0656; H01S 3/10084
See application file for complete search history.

(56) References Cited

U.S. PATENT DOCUMENTS 6,215,095 B1    4/2001  Partanen et al.
9,486,877 B2   11/2016  Unrath
(Continued)

FOREIGN PATENT DOCUMENTS

EP    2528172 A2    11/2012

OTHER PUBLICATIONS

International Application # PCT/US2018/37970 search report dated Oct. 22, 2018.

*Primary Examiner* — Yuanda Zhang
(74) *Attorney, Agent, or Firm* — Kligler & Associates (57) ABSTRACT

A laser system includes a master oscillator, which emits a train of optical seed pulses with variable intervals between the pulses. An optical power amplifier includes an optical gain medium, which receives and amplifies the optical seed pulses from the master oscillator, and a pump, which applies pump radiation to the optical gain medium. A pulse generator applies a control input to the master oscillator, which causes the intervals between the optical seed pulses to vary by at least 50% at a rate of change that is greater than a response frequency of the optical gain medium. A control unit drives the pump responsively to predicted intervals between the optical seed pulses, at a variable pump power selected so that the pulse amplitudes of the output pulses vary by no more than 20% irrespective of the varying intervals between the optical seed pulses.

16 Claims, 4 Drawing Sheets

(56) References Cited

U.S. PATENT DOCUMENTS

| | | | |
|---|---|---|---|
| 2005/0225846 A1* | 10/2005 | Nati | H01S 3/06758 359/341.1 |
| 2008/0198445 A1 | 8/2008 | Murison et al. | |
| 2011/0019705 A1* | 1/2011 | Adams | H01S 3/1301 372/25 |
| 2012/0300288 A1* | 11/2012 | Ogaki | H01S 3/06754 359/337.11 |
| 2013/0177032 A1* | 7/2013 | Berendt | H01S 3/1306 372/9 |
| 2014/0218791 A1* | 8/2014 | Desbiens | H01S 3/06758 359/345 |
| 2015/0229097 A1* | 8/2015 | Oba | H01S 3/06754 372/6 |
| 2016/0172819 A1* | 6/2016 | Ogaki | H01S 3/06754 219/121.8 |
| 2016/0197451 A1* | 7/2016 | Kraemer | H01S 3/10015 372/25 |
| 2017/0153319 A1* | 6/2017 | Villeneuve | G01S 17/00 |

* cited by examiner

CONTROLLING OUTPUT POWER OF A LASER AMPLIFIER WITH VARIABLE PULSE RATE

CROSS-REFERENCE TO RELATED APPLICATION

This application claims the benefit of U.S. Provisional Patent Application 62/563,696, filed Sep. 27, 2017, which is incorporated herein by reference.

FIELD OF THE INVENTION

The present invention relates generally to optoelectronic systems, and particularly to devices and methods for driving and controlling pulsed lasers.

BACKGROUND

The Master-Oscillator Power Amplifier (MOPA) laser architecture is useful in applications requiring both high output pulse power and tight control of optical beam quality and wavelength. In the MOPA configuration, a low-power seed laser generates a train of initial pulses, which are then amplified by amplified stimulated emission (ASE) in one or more laser amplifiers to generate the desired high-power output. The last amplification stage is commonly referred to as the power amplifier, with prior stages termed "pre-amplifiers."

Fiber lasers are often used in MOPA configurations. In a fiber laser, the active gain medium is an optical fiber, which is doped with rare-earth ions, such as erbium (Er), ytterbium (Yb), or combinations of multiple elements. The gain medium is optically pumped, for example by radiation emitted by a semiconductor laser diode, which can be injected into the cladding of the doped fiber.

SUMMARY

Embodiments of the present invention that are described hereinbelow provide improved laser systems and methods for control of such systems.

There is therefore provided, in accordance with an embodiment of the invention, a laser system, including a master oscillator, which is configured to emit a train of optical seed pulses at a selected wavelength with variable intervals between the pulses. An optical power amplifier includes an optical gain medium, which is coupled to receive and amplify the optical seed pulses from the master oscillator so as to generate corresponding output pulses, having respective pulse amplitudes determined by a gain of the optical gain medium at the selected wavelength. A pump is coupled to apply pump radiation to the optical gain medium. A pulse generator is coupled to apply a control input to the master oscillator, which causes the intervals between the optical seed pulses to vary by at least 50% at a rate of change that is greater than a response frequency of the optical gain medium. A control unit is coupled to drive the pump responsively to predicted intervals between the optical seed pulses, at a variable pump power selected by the control unit in response to the control input so that the pulse amplitudes of the output pulses vary by no more than 20% irrespective of the varying intervals between the optical seed pulses.

In some embodiments, the control unit includes a nonlinear estimator, which is configured to predict a future inversion state of the optical gain medium based on the predicted intervals between the optical seed pulses, wherein the control unit sets the pump power responsively to the predicted inversion state. In a disclosed embodiment, the apparatus includes an optical sensor, which is configured to measure an indicator of a current inversion state of the optical gain medium, wherein the nonlinear estimator is configured to predict the future inversion state based on the predicted intervals between the optical seed pulses, the current inversion state, and the pump power set by the control unit. The measured indicator can be selected from a group of indicators consisting of the pulse amplitudes of the output pulses; the gain of the optical gain medium; an absorption of the pump radiation by the optical gain medium; amplified spontaneous emission by the optical gain medium; and an amplification by the optical gain medium of a probe signal at a test wavelength, which is different from the selected wavelength.

Additionally or alternatively, the pulse generator causes the intervals between the optical seed pulses to vary in accordance with at least one predefined schedule, wherein the predicted intervals are derived from the at least one predefined schedule. In one embodiment, the pulse generator is configured to select among a plurality of predefined schedules, and the control unit is configured to set the variable pump power so that the pulse amplitudes of the output pulses vary by no more than 20% during operation according to each of the schedules and during changes between the schedules. In a disclosed embodiment, the apparatus includes a scanner, which is configured to scan the output pulses over a predefined angular range at a variable angular velocity, and the predefined schedule is selected so that the output pulses are distributed by the scanner with a fixed angular spacing between the output pulses.

Further additionally or alternatively, the control unit includes a look-up table, containing entries corresponding to an optimal pump power for each predicted interval.

In the disclosed embodiments, the optical gain medium includes a doped optical fiber. In one embodiment, the apparatus includes an optical preamplifier coupled between the master oscillator and the optical power amplifier, wherein the control unit is further configured to vary a preamplifier pump power that is applied to the optical preamplifier in order to control the pulse amplitudes of the output pulses.

There is also provided, in accordance with an embodiment of the invention, a method for operating a laser system. The method includes configuring a master oscillator to emit a train of optical seed pulses at a selected wavelength with variable intervals between the pulses. An optical gain medium of an optical power amplifier is coupled to receive and amplify the optical seed pulses from the master oscillator so as to generate corresponding output pulses, having respective pulse amplitudes determined by a gain of the optical gain medium at the selected wavelength. A control input is applied to the master oscillator, which causes the intervals between the optical seed pulses to vary by at least 50% at a rate of change that is greater than a response frequency of the optical gain medium. A pump is driven to apply pump radiation to the optical gain medium responsively to predicted intervals between the optical seed pulses, at a variable pump power selected in response to the control input so that the pulse amplitudes of the output pulses vary by no more than 20% irrespective of the varying intervals between the optical seed pulses.

The present invention will be more fully understood from the following detailed description of the embodiments thereof, taken together with the drawings in which:

DETAILED DESCRIPTION OF EMBODIMENTS

MOPA fiber lasers are uniquely suited to delivering high-power pulses in the near infrared, for example at wavelengths in the vicinity of 1.5 µm, with good beam quality and repetition rates varying over kilohertz to megahertz ranges. The amplitude of the output pulses from the MOPA (i.e., the energy or peak power per pulse) depends on the population inversion of excited dopant ions in the optical gain medium of the power amplifier. This inversion is depleted in each output pulse and restored by absorption of pump radiation during the intervals between pulses. Because of the physical processes involved in energy transfer from the pump radiation to the inverted state of the dopant ions and the storage capacity of the ions themselves, the time constant for response of the optical gain medium to the pump radiation, i.e., the time required to fully repopulate the inverted state after depletion, is long—in the millisecond range.

When the master oscillator is operating at a constant pulse rate, the depletion and repopulation processes will reach an equilibrium, in which constant output amplitude can be easily maintained. In some applications, however, the intervals between the optical seed pulses emitted by the master oscillator are intentionally varied, leading to variations in the amplitudes of the output pulses due to the lag in repopulation. In certain cases, the intervals between optical seed pulses can vary quickly, for example at a rate of change that is at least 50% greater than the response frequency of the optical gain medium (i.e., the inverse of the time constant for response mentioned above). In this sort of situation, the output pulse amplitude can vary sharply with the varying intervals between pulses.

Embodiments of the present invention that are described herein provide novel control schemes that enable the MOPA laser to maintain output pulse amplitudes that are substantially constant, notwithstanding rapid variations in pulse intervals. In the disclosed embodiments, a pulse generator applies a control input to the master oscillator, which causes the intervals between the optical seed pulses to vary rapidly, as noted above. A control unit drives the pump of the power amplifier in response to the control input at a pump power that varies in dependence upon predicted intervals between the optical seed pulses, i.e., on the sequence of pulse intervals that is expected to occur over the next control period. This predictive approach enables the control unit to select the pump power so that the pulse amplitudes of the output seed pulses vary by no more than a predefined threshold, for example, no more than 20%, over a large, well-defined range of varying intervals between the optical seed pulses.

Although the embodiments described hereinbelow relate specifically to MOPA fiber lasers, where the problem of mismatch between pulse rate and response time of the optical gain medium is particularly acute, the principles of the present invention may similarly be applied to other sorts of pulsed lasers that operate in a MOPA configuration.

Figure 1:
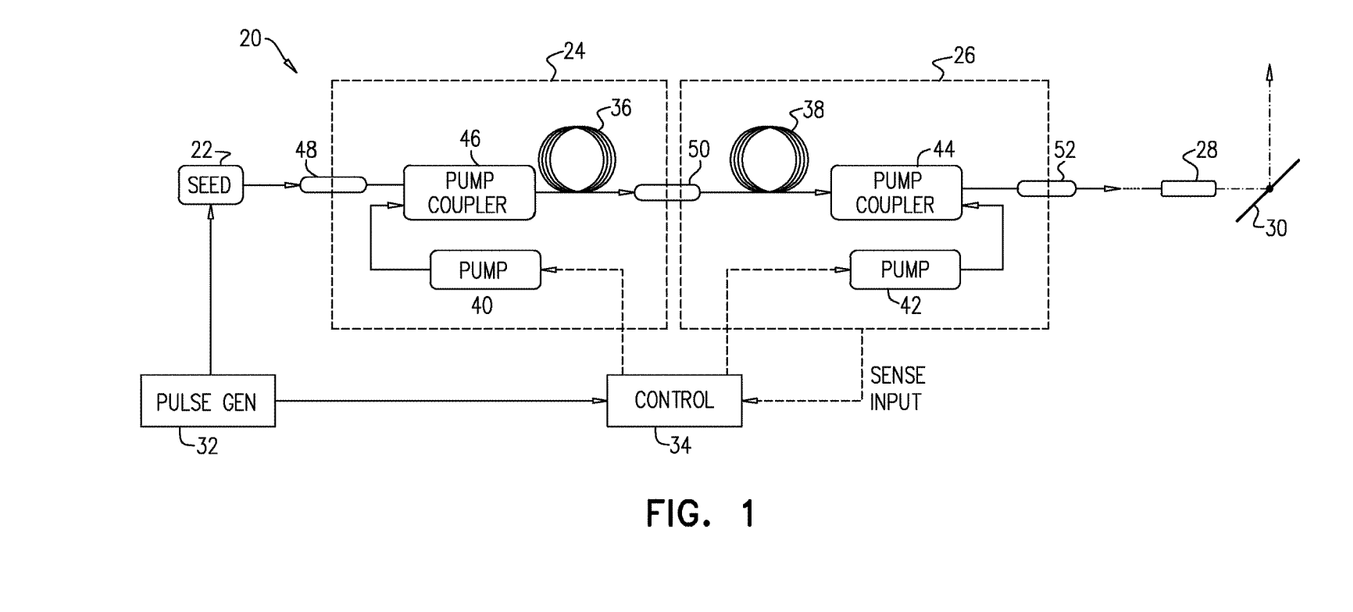
FIG. 1 is a block diagram that schematically illustrates a laser system, in accordance with an embodiment of the invention.

FIG. 1 is a block diagram that schematically illustrates a laser system 20, in accordance with an embodiment of the invention. System 20 comprises a master oscillator 22, also referred to as a seed oscillator, which emits a train of optical seed pulses at a selected wavelength. The optical seed pulses are input, via a coupler 48, to an optical preamplifier 24, which amplifies and inputs the pulses, via a coupler 50, to a power amplifier 26. (Preamplifier 24 is an optional component of system 20; and in alternative embodiments, the system may comprise only a single power amplifier stage. Alternatively, the system may comprise two or more preamplifier stages between the master oscillator and the power amplifier.) The high-power pulses from power amplifier 26 are output via an output coupler 52 and, in the present example, directed by a collimating lens 28 toward a scanner, such as a scanning mirror 30.

Scanning mirror 30 sweeps back and forth in order to scan the output pulses over a predefined angular range at high speed. For this purpose, scanning mirror 30 may comprise a resonant scanner, which rotates at an angular velocity that varies of the scan range (fastest in the center, and slowing to zero at the edges of the scan before reversing direction). Consequently, if master oscillator 22 were to emit the optical seed pulses with a constant pulse repetition interval between pulses, the angles between the output pulses reflected from scanning mirror 30 would also vary substantially.

In some applications, however, it is desirable that the output pulses be distributed by the scanner with a fixed angular spacing between the output pulses. In order to achieve this object, a pulse generator 32 applies a control input to master oscillator 22, which causes the intervals between the optical seed pulses to vary in accordance with a predefined schedule. This schedule is chosen so as to compensate for the varying angular speed of scanning mirror 30, by varying the intervals between the optical seed pulses inversely to the variation of the angular speed of the scanner. As a result, the intervals between the optical seed pulses will vary by at least 50%, and possibly by considerably more, depending on the chosen scan range and scan mirror dynamics. For a sinusoidal scan, for example, the difference between the scan center and edge can represent a variation in pulse intervals by a factor of ten or more. Alternatively, the techniques described herein are equally applicable to other sorts of pulse patterns with variable intervals between pulses.

The scanning configuration of system 20 is cited here, for the sake of concreteness and clarity, as one example of an application in with the intervals between optical seed pulses vary rapidly. At the same time, a control unit controls power amplifier 26 (and possibly also preamplifier 24) so that the amplitudes of the pulses output from power amplifier 26 remain within tightly-defined bounds, for example varying by no more than 20% irrespective of the varying intervals between the optical seed pulses, or possibly varying by no more than 10% or even less. This control functionality, as described further hereinbelow, is useful in controlling the output pulse amplitudes under circumstances of varying pulse intervals not only in the scanning configuration of system that is shown in FIG. 1, but also in other laser applications in which pulse intervals can vary rapidly.

Although pulse generator 32 and control unit 34 are shown, for the sake of conceptual clarity, as separate functional units, these components of system 20 may conveniently be embodied in a single electronic unit, for example as a single integrated circuit or circuit components on a printed circuit board. Pulse generator 32 and control unit 34 typically comprise digital logic circuits and memory components, along with suitable digital/analog and analog/digital interfaces for carrying out the functions that are described herein. Additionally or alternatively, at least some of these functions may be carried out in software or firmware running on a programmable processor that is embedded in or otherwise associated with control unit 34.

In the present embodiments, preamplifier 24 and power amplifier 26 comprise fiber lasers, based on optical gain media 36 and 38, respectively. For example, the optical gain media may comprise Er-doped or Yb/Er-doped fibers, which are configured to amplify optical pulses in a band around 1550 nm. Master oscillator 22 comprises, for example, a laser diode, such as a distributed Bragg reflector (DBR) or distributed feedback (DFB) laser diode, which inputs well-controlled, narrowband seed pulses to preamplifier 24 at the desired wavelength. Couplers 48, 50 and 52 in system 20, as are known in the art, typically comprise optical isolators, to prevent feedback of optical radiation, and may also comprise wavelength and polarization filters to help maintain narrow bandwidth and precise mode control in the output pulses.

Optical pumps 40 and 42, for example laser diodes operating in a band between 900 and 1000 nm, apply pump radiation to drive optical gain media 36 and 38. The pump radiation is input to the gain media via a wavelength-domain multiplexer (WDM) 46 or a cladding coupler 44, which injects the pump radiation into the cladding of the doped optical fiber that constitutes the core of the optical gain media. The pump radiation may be co- or counter-propagating relative to the seed pulses. Absorption of the pump radiation in the doped fiber core causes an inversion in the energy states of the dopant (for example, in the Er ions), giving rise to optical gain at the target wavelength. The pump intensity determines the gain of the optical media and hence the amplitude of the output pulses emitted from power amplifier 26. As explained earlier, because of the inherent time delay in transferring energy from the pump wavelength to the excited state of the rare-earth dopant, the response frequency of optical gain media 36 and 38 is considerably slower than the rate of change of the intervals between the optical seed pulses emitted by master oscillator 22, which vary in accordance with a control input from pulse generator 32.

In the present example, pulse generator 32 drives master oscillator 22 to emit optical seed pulses in accordance with a predefined schedule (for example, to compensate for the varying angular velocity of scanning mirror 30, as explained above). The rapid variation of the intervals between the pulses is thus predictable. Control unit 34 drives pump 42 (and possibly pump 40, as well) on the basis of these predicted intervals to vary the pump power over time so that the amplitudes of the output pulses from power amplifier 26 vary by no more than a predefined bound, for example 20%, irrespective of the varying intervals between the optical seed pulses. In some applications, pulse generator 32 may select among multiple possible schedules. In such cases, control unit 34 sets the pump power so that the pulse amplitudes of the output pulses vary remain within the predefined bound during operation according to each of the schedules and during changes between the schedules Typically, for high gain, optical gain medium 38 is pumped to operate in a saturated regime, in which its response to input pulses is nonlinear. To adjust the pump power correctly in the face of this nonlinearity, control unit 34 comprises, in some embodiments, a nonlinear estimator, which predicts the future inversion state of the optical gain medium based on the predicted intervals between the optical seed pulses and sets the pump power level accordingly. (Details of such estimators are described hereinbelow with reference to FIGS. 3 and 4.) Furthermore, control unit 34 can receive an indicator of the current inversion state of optical gain medium 38 from an optical sensor for use by the nonlinear estimator in predicting the future state. Possible sensor configurations for this purpose are described below.

Figure 2:
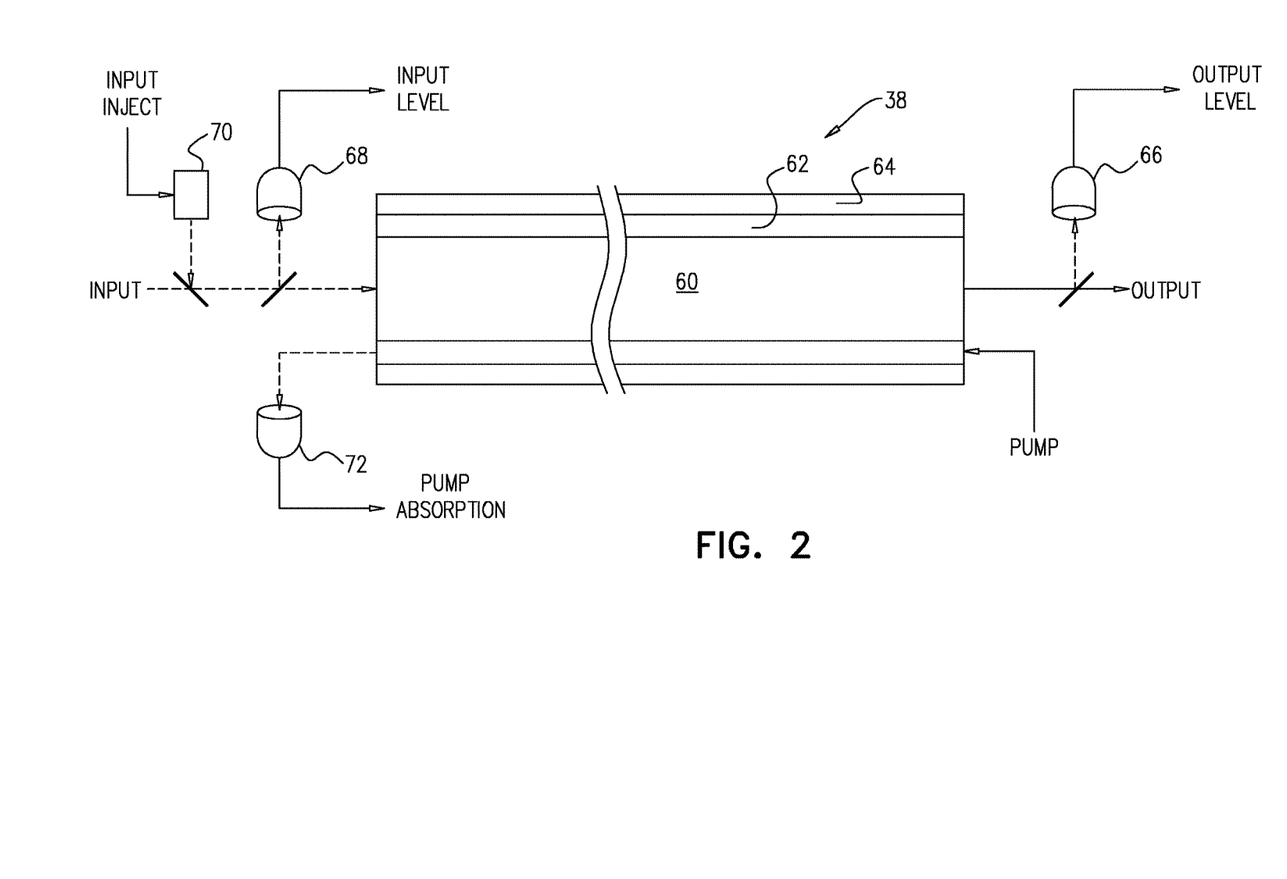
FIG. 2 is a schematic sectional view of an optical gain medium with associated optical sensors, in accordance with an embodiment of the invention.

FIG. 2 is a schematic sectional view of optical gain medium 38 with associated optical sensors, in accordance with an embodiment of the invention. This figure assumes that optical gain medium 38 comprises a core 60, containing dopant ions, which amplifies the input optical pulses, for example at 1550 nm. In the view shown in FIG. 2, these input pulses enter core 60 from the left, and amplified output pulses exit the core from the right. The pump radiation, in the 900-1000 nm range, is input to an inner cladding 62, from which it propagates into and is absorbed in core 60. Inner cladding 62 is covered by a protective outer cladding 64.

FIG. 2 shows a number of possible sensor configurations, in addition to amplification of the input pulses by gain medium 38. These sensor configurations may be used individually or in any combination to provide inputs to control unit 34:

An optical sensor 66, such as a suitable monitoring photodiode (MPD), measures the amplitude (in terms of peak power or energy, depending upon the measurement bandwidth) of the output pulses.

An optical sensor 68 can similarly measure the amplitudes of the input pulses to optical gain medium 38. Comparing this input level to the output level indicated by sensor 66 gives a direct indication of the gain of the medium at the output wavelength of system 20.

An optical source 70, such as a diode laser operating at an appropriate test wavelength (different from the wavelength of the output pulses), inputs an optical probe signal to core 60. The input to sensor 66 can be filtered so that this sensor measures the amplification or absorption by the optical gain medium of the probe signal, which can be indicative of the level of population inversion in the core. For example, source 70 may inject the test signal in an Er emission band to measure the Er inversion directly; or it may inject the test signal in a Yb emission band (in the vicinity of 1 μm), which indicates the population of the excited Yb state, which is the precursor state responsible for transferring energy to the Er dopant in a Yb/Er-doped fiber.

An optical sensor 72 measures the absorption of the pump radiation by optical gain medium 38, which likewise gives an indication of the gain of the medium. The amplitude of the pump radiation that is measured by sensor 72 can be extracted from cladding 72 or by means of a wavelength-domain multiplexer (not shown in this figure).

Alternatively or additionally, optical sensor 72 can be used to measure the amplified spontaneous emission of the pump and/or signal band, which gives an indication of the gain of the medium.

Figure 3:
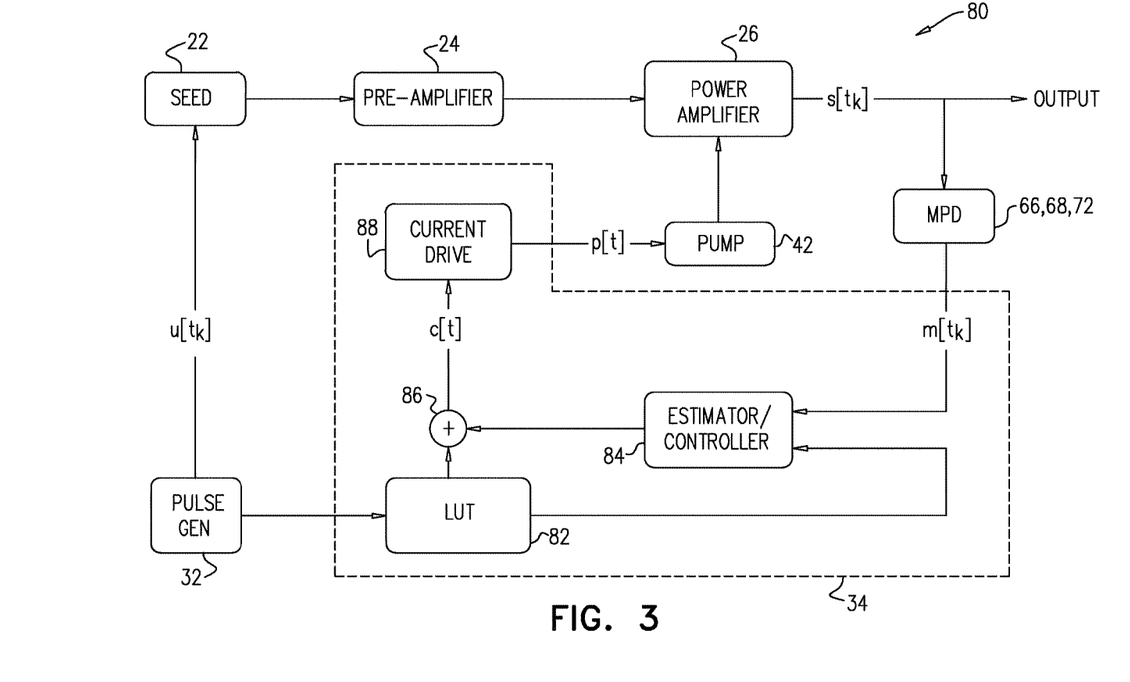
FIG. 3 is a block diagram that schematically shows details of a control unit for a laser system, in accordance with an embodiment of the invention.

FIG. 3 is a block diagram that schematically shows details of control unit 34 in a laser system 80, in accordance with an embodiment of the invention. Aside from the detailed design of the control unit, system 80 is similar in structure and operation to system 20, as described above.

In this embodiment, control unit 34 comprises a look-up table (LUT) 82, containing entries corresponding to the optimal pump power for either a) each predicted interval between pulses or b) a set of predefined pulse interval sequences. Pulse generator 32 inputs control pulses u(tk) to master oscillator 22, according to a schedule that is input to control unit 34, as well. Based on the pulse intervals, LUT 82 outputs optimal control values to a nonlinear estimator 84, as well as to an adder 86. Estimator 84 also receives readings m(tk) from one or more of sensors 66, 68, 72, giving an indication of the current inversion state of optical gain medium 38.

Estimator 84 may comprise any suitable sort of nonlinear estimator that is known in the art, such as an extended Kalman filter or an unscented Kalman filter. Based on the sensor readings m(tk) and the outputs from LUT 82, estimator 84 generates a digital control output c(t) (possibly by summation with an output of LUT 82 in adder 86) to a current driver 88. The current driver outputs a pulsed pump signal p(t) to pump 42, which drives power amplifier 26 accordingly at a pump power level that is chosen so as to maintain the amplitudes of the output pulses s(tk) within the appropriate bounds. Details of the population of LUT 82 and the operation of an extended Kalman filter used in estimator 84, in accordance with an example embodiment, are presented in the above-mentioned provisional patent application.

Alternatively, control unit 34 may use LUT 82 in a feedforward mode only, without the state estimation function of estimator 84. In this case, control unit 34 simply applies the predicted intervals between control pulses u(tk) to LUT 82 in order to determine the control output c(t). LUT 82 may be populated using an optimizer, which models the average power output of power amplifier 26 by assuming a constant pulse rate, and seeks to find the pump power that will minimize variations in the amplitude of the output pulses for each possible interval between pulses. In addition, the contents of the LUT may be updated during operation using pulse amplitude (energy) measurements sensed as described above. In this way, the LUT may be re-optimized during operation to account for changes in laser response due to, for example, thermal variation or other effects encountered in operation of system 20.

Figure 4:
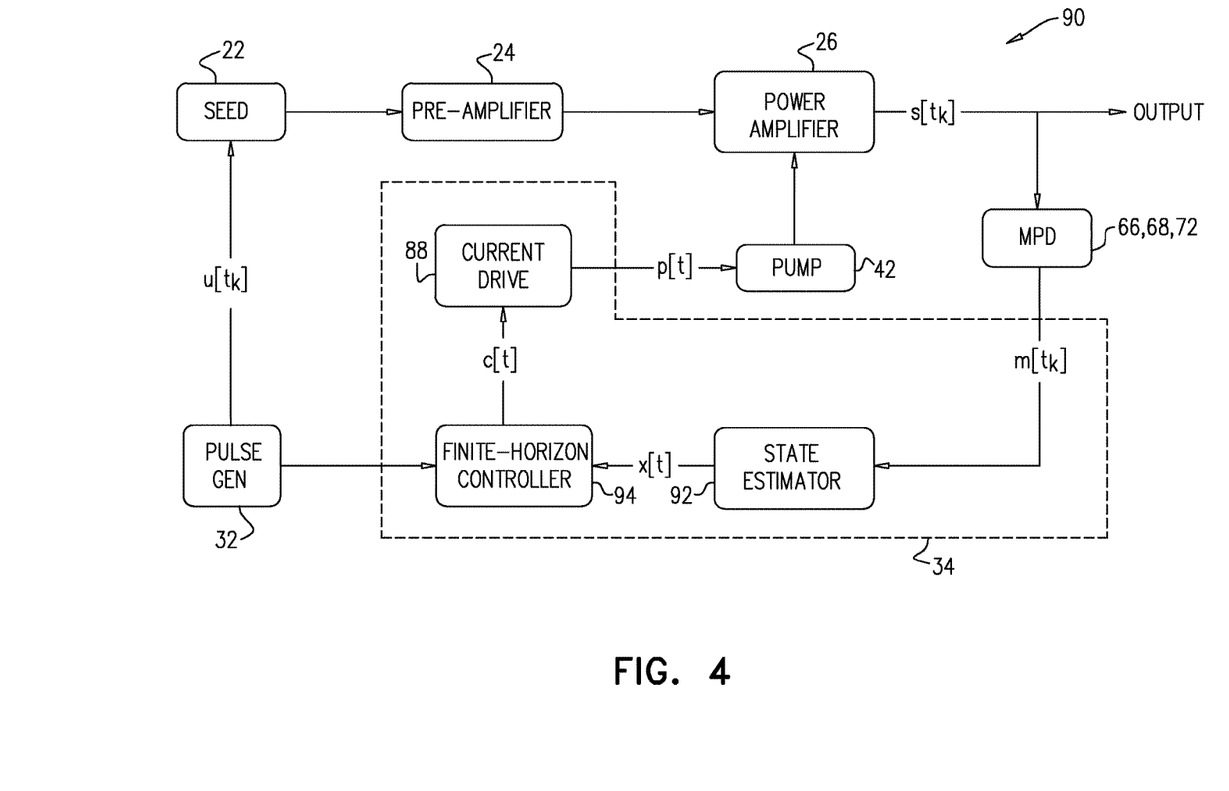
FIG. 4 is a block diagram that schematically shows details of a control unit for a laser system, in accordance with another embodiment of the invention.

FIG. 4 is a block diagram that schematically shows details of control unit 34 in a laser system 90, in accordance with another embodiment of the invention. Again, aside from the detailed design of the control unit, system 90 is similar in structure and operation to system 20, as described above.

In this case, controller 34 comprises a nonlinear state estimator 92, which outputs an estimate x(t) of the current inversion state of optical gain medium 38 following each pulse. As in the preceding embodiment, estimator 92 can be implemented as an extended or unscented Kalman filter. The state estimate x(t) is input to a finite-horizon controller 94, together with the schedule of pulse intervals from pulse generator 32. Controller 94 may be based, for example, on a linear quadratic regulator (LQR) or on model predictive control (MPC), as are known in the art. Such controller implementations enable planning or predictive control of pump 42 in anticipation of, for example, arbitrary pulse intervals generated by pulse generator 32. This sort of configuration is computationally complex but can be implemented in a digital controller to give near-optimal propagation of laser state and control of pump power.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A laser system, comprising:
    a master oscillator, which is configured to emit a train of optical seed pulses at a selected wavelength with variable intervals between the pulses;
    an optical power amplifier, comprising:
        an optical gain medium, which is coupled to receive and amplify the optical seed pulses from the master oscillator so as to generate corresponding output pulses, having respective pulse amplitudes determined by a gain of the optical gain medium at the selected wavelength; and
        a pump, which is coupled to apply pump radiation to the optical gain medium;
    a scanner, which is configured to scan the output pulses over a predefined angular range at a variable angular velocity;
    a pulse generator, which is coupled to apply a control input to the master oscillator, wherein the control input causes the intervals between the optical seed pulses to vary by at least 50% in accordance with at least one predefined schedule, and wherein a rate of change of the intervals between the pulses is greater than a response frequency of the optical gain medium, and wherein the at least one predefined schedule is selected so that the output pulses are distributed by the scanner with a fixed angular spacing between the output pulses; and
    a control unit, which is coupled to drive the pump responsively to predicted intervals between the optical seed pulses, wherein the predicted intervals are derived from the at least one predefined schedule, at a variable pump power selected by the control unit in response to the control input so that the pulse amplitudes of the output pulses vary by no more than 20% irrespective of the varying intervals between the optical seed pulses.

2. The system according to claim 1, wherein the control unit comprises a nonlinear estimator, which is configured to predict a future inversion state of the optical gain medium based on the predicted intervals between the optical seed pulses, wherein the control unit sets the pump power responsively to the predicted inversion state.

3. The system according to claim 2, and comprising an optical sensor, which is configured to measure an indicator of a current inversion state of the optical gain medium, wherein the nonlinear estimator is configured to predict the future inversion state based on the predicted intervals between the optical seed pulses, the current inversion state, and the pump power set by the control unit.

4. The system according to claim 3, wherein the measured indicator is selected from a group of indicators consisting of:
    the pulse amplitudes of the output pulses;
    the gain of the optical gain medium;
    an absorption of the pump radiation by the optical gain medium;
    amplified spontaneous emission by the optical gain medium; and
    an amplification by the optical gain medium of a probe signal at a test wavelength, which is different from the selected wavelength.

5. The system according to claim 1, wherein the pulse generator is configured to select among a plurality of predefined schedules, and wherein the control unit is configured to set the variable pump power so that the pulse amplitudes of the output pulses vary by no more than 20% during operation according to each of the schedules and during changes between the schedules.

6. The system according to claim 1, wherein the control unit comprises a look-up table, containing entries corresponding to an optimal pump power for each predicted interval.

7. The system according to claim 1, wherein the optical gain medium comprises a doped optical fiber.

8. The system according to claim 7, and comprising an optical preamplifier coupled between the master oscillator and the optical power amplifier, wherein the control unit is further configured to vary a preamplifier pump power that is applied to the optical preamplifier in order to control the pulse amplitudes of the output pulses.

9. A method for operating a laser system, comprising:
configuring a master oscillator to emit a train of optical seed pulses at a selected wavelength with variable intervals between the pulses;
coupling an optical gain medium of an optical power amplifier to receive and amplify the optical seed pulses from the master oscillator so as to generate corresponding output pulses, having respective pulse amplitudes determined by a gain of the optical gain medium at the selected wavelength;
scanning the output pulses over a predefined angular range at a variable angular velocity;
applying a control input to the master oscillator, wherein the control input causes the intervals between the optical seed pulses to vary by at least 50% in accordance with at least one predefined schedule, and wherein a rate of change of the intervals between the pulses is greater than a response frequency of the optical gain medium, and wherein the at least one predefined schedule is selected so that the output pulses are distributed by the scanning with a fixed angular spacing between the output pulses; and
driving a pump to apply pump radiation to the optical gain medium responsively to predicted intervals between the optical seed pulses, wherein the predicted intervals are derived from the at least one predefined schedule, at a variable pump power selected in response to the control input so that the pulse amplitudes of the output pulses vary by no more than 20% irrespective of the varying intervals between the optical seed pulses.

10. The method according to claim 9, wherein driving the pump comprises applying a nonlinear estimator to predict a future inversion state of the optical gain medium based on the predicted intervals between the optical seed pulses, and setting the pump power responsively to the predicted inversion state.

11. The method according to claim 10, and comprising optically measuring an indicator of a current inversion state of the optical gain medium, wherein the nonlinear estimator is configured to predict the future inversion state based on the predicted intervals between the optical seed pulses, the current inversion state, and the pump power set by the control unit.

12. The method according to claim 11, wherein the measured indicator is selected from a group of indicators consisting of:
the pulse amplitudes of the output pulses;
the gain of the optical gain medium;
an absorption of the pump radiation by the optical gain medium;
amplified spontaneous emission by the optical gain medium; and
an amplification by the optical gain medium of a probe signal at a test wavelength, which is different from the selected wavelength.

13. The method according to claim 9, wherein varying the intervals comprises selecting among a plurality of predefined schedules, and wherein driving the pump comprises setting the variable pump power so that the pulse amplitudes of the output pulses vary by no more than 20% during operation according to each of the schedules and during changes between the schedules.

14. The method according to claim 9, wherein driving the pump comprises reading entries from a look-up table corresponding to an optimal pump power for each predicted interval.

15. The method according to claim 9, wherein the optical gain medium comprises a doped optical fiber.

16. The method according to claim 15, and comprising coupling an optical preamplifier between the master oscillator and the optical gain medium, and varying a preamplifier pump power that is applied to the optical preamplifier in order to control the pulse amplitudes of the output pulses.

* * * * *

UNITED STATES PATENT AND TRADEMARK OFFICE
CERTIFICATE OF CORRECTION

PATENT NO. : 10,333,269 B2
APPLICATION NO. : 15/849700
DATED : June 25, 2019
INVENTOR(S) : Ido Luft, Andrew Sutton and Ronen Akerman Page 1 of 1

It is certified that error appears in the above-identified patent and that said Letters Patent is hereby corrected as shown below:

In the Specification

In Column 6, Line 56, delete "cladding 72" and insert --cladding 62-- therefor.

Signed and Sealed this
Nineteenth Day of November, 2019

Andrei Iancu
*Director of the United States Patent and Trademark Office*